United States Patent
Kim (10) Patent No.: US 6,694,422 B1
(45) Date of Patent: Feb. 17, 2004

(54) SEMICONDUCTOR MEMORY DEVICE HAVING ADJUSTABLE PAGE LENGTH AND PAGE DEPTH

(75) Inventor: Gyu-hong Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/419,711

(22) Filed: Oct. 14, 1999

(30) Foreign Application Priority Data

Oct. 19, 1998 (KR) .......................................... 98-43713

(51) Int. Cl.[7] ............................................. G06F 12/00
(52) U.S. Cl. ...................... 711/217; 711/104; 711/154; 711/212; 711/220; 365/189.05; 365/230.03; 365/238.5
(58) Field of Search ....................... 365/189.05, 230.03, 365/230.08, 238.5; 711/104, 105, 147, 154, 170, 209, 211, 212, 217, 220

(56) References Cited

U.S. PATENT DOCUMENTS

| | | | | |
|---|---|---|---|---|
| 6,041,016 A | * | 3/2000 | Freker | 365/230.02 |
| 6,112,285 A | * | 8/2000 | Ganapathy et al. | 711/203 |
| 6,125,432 A | * | 9/2000 | Hanami et al. | 345/545 |
| 6,212,612 B1 | * | 4/2001 | Turner | 709/200 |

FOREIGN PATENT DOCUMENTS

JP 363289659 A1 * 11/1988 ........... G06F/12/14

* cited by examiner

*Primary Examiner*—Donald Sparks
*Assistant Examiner*—Christian P. Chace
(74) *Attorney, Agent, or Firm*—Harness, Dickey & Pierce, P.L.C.

(57) ABSTRACT

A semiconductor device with adjustable number of pages and page depth is disclosed. The semiconductor device includes multiple memory cell array blocks, a page control circuit for generating a control signal which varies the number of pages and the page depth in response to a page control signal, and a sense amplifying and write driving circuit. The page control circuit controls a row address and a column address to generate the control signal, that is, to vary the number of pages and the page depth. The sense amplifying and write driving circuit senses, amplifies and outputs data from a memory cell array block, and writes data into a memory cell array block in response to the control signal. The page control circuit includes an address buffer, a block controller and a control signal generator. The address buffer buffers the most significant bit (MSB) of the row address and outputs the buffered result, or ignores the MSB depending on the page control signal. The block controller generates a block select signal in response to the MSB and a bit next to the MSB of the row address, and the control signal generator, depending on the page control signal, selects between the MSB of the column address and the block select signal as the control signal.

10 Claims, 6 Drawing Sheets

SEMICONDUCTOR MEMORY DEVICE HAVING ADJUSTABLE PAGE LENGTH AND PAGE DEPTH

BACKGROUND OF THE INVENTION

1. Field of the Invention

The present invention relates to a semiconductor device, and more particularly, to a semiconductor memory device having adjustable length and number of pages.

2. Description of the Related Art

In a typical semiconductor memory device, when an internal memory cell array block is accessed, the number of bits in a row address and the number of bits in a column address are fixed. Further, since the numbers of bits in the row address and the column address respectively determine the number of pages (also referred to as the page depth) and page length of the device, and the typical semiconductor device has a fixed number of pages and a fixed page length. However, recent multimedia technology requires a semiconductor memory device having an adjustable number of pages and an adjustable page lengths.

Figure 1:
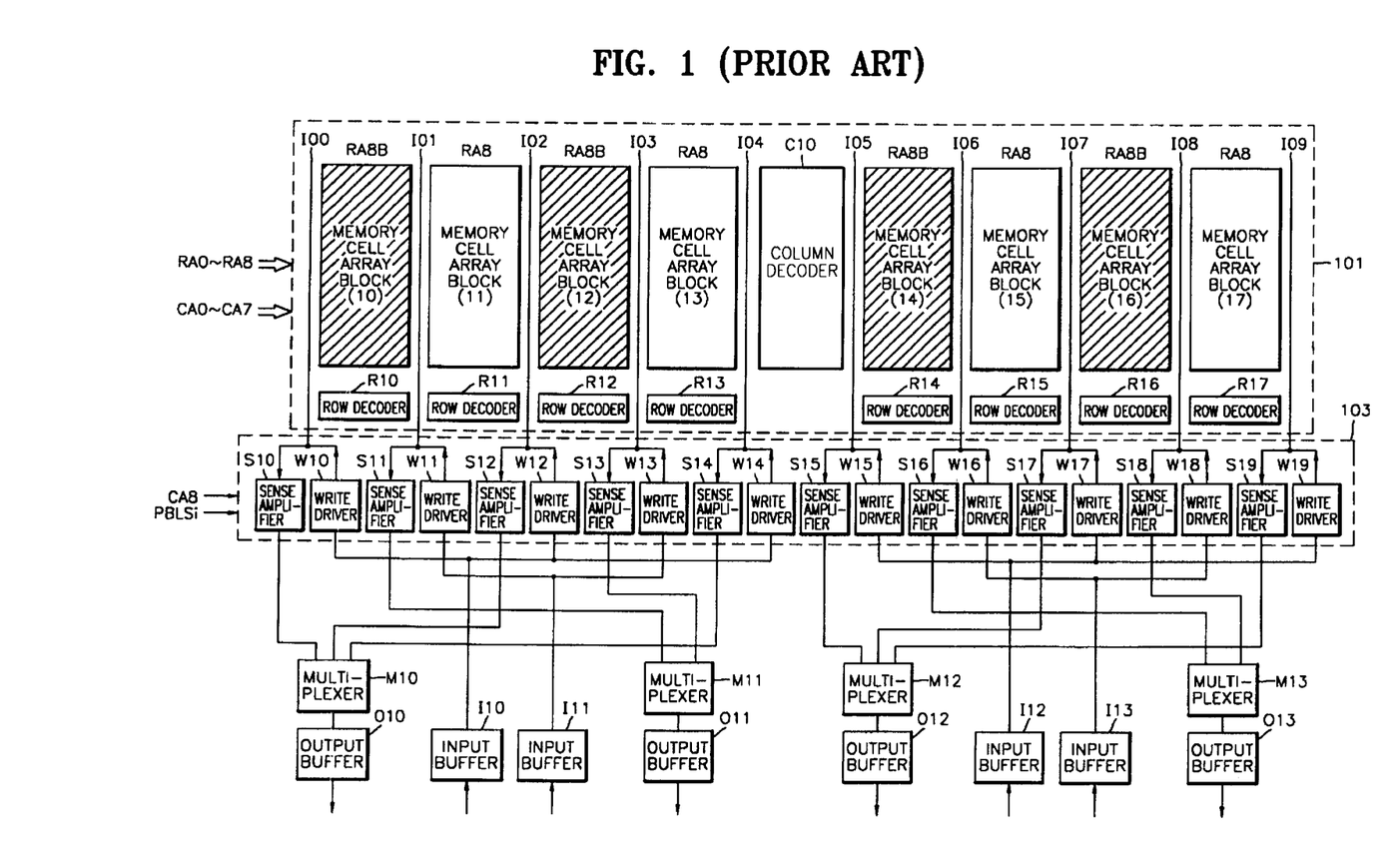
FIG. 1 is a block diagram of a conventional semiconductor memory device.

FIG. 1 is a block diagram showing the architecture of a conventional 1 Megabit (Mb) DRAM. In the DRAM, the row address is 9 bits RA0 to RA8, the column address is 9 bits CA0 to CA8, and the data bus is 4 bits wide.

Referring to FIG. 1, the DRAM includes a memory block 101, a sense amplifying and write driving block 103, four input buffers I10 to I13, four output multiplexers M10 to M13, and four output buffers O10 to O13. Memory block 101 has eight memory cell array blocks 10 to 17, eight local row decoders R10 to R17 and a column decoder C10. Sense amplifying and write driving block 103 includes ten sense amplifiers S10 to S19.

A ninth bit RA8 of a row address that was input from outside of the DRAM selects either memory cell array blocks 10, 12, 14, and 16 or memory cell array blocks 11, 13, 15 and 17. Eight row address bits RA0 to RA7 select a wordline (not shown) of each of memory cell array blocks 10 to 17. For example, when ninth bit RA8 of the row address is low, that is, an inverted bit RA8B is high, memory cell array blocks 10, 12, 14 and 16 are selected. When ninth bit RA8 of the row address is high, memory cell array blocks 11, 13, 15 and 17 are selected. The number of wordlines, i.e., the number of pages in each of memory cell array blocks 10 to 17 is 256.

Column lines (not shown) of each of memory cell array blocks 10 to 17 are selected by bits CA0 to CA7 of the column address that was input from outside of the DRAM. The ninth column address bit controls sense amplifiers S10 to S19 and the write drivers W10 to W19. Accordingly, the number of columns in each of memory cell array blocks 10 to 17 is 256. When both ninth bit RA8 of the row address and ninth bit CA8 of the column address are low, memory cell array blocks 10 and 14 are selected for access. When ninth bit RA8 of the row address is low, and ninth bit CA8 of the column address is high, memory cell array blocks 12 and 16 are selected for access. When ninth bit RA8 of the row address is high, and ninth bit CA8 of the column address is low, memory cell array blocks 11 and 15 are selected for access. When both ninth bit RA8 of the row address and ninth bit CA8 of the column address are high, memory cell array blocks 13 and 17 are selected for access.

In the DRAM of FIG. 1, a single data access accesses two memory cell array blocks 10 and 14, 11 and 15, 12 and 16, or 13 and 17. A page includes four rows of memory cells, one row from each of four memory cell array blocks 10 to 13 or 14 to 17. Thus, the page length is twice the number of column in a single memory cell array block or 512, and the number of pages is twice the number of rows in a single memory cell array block.

Figure 2A:
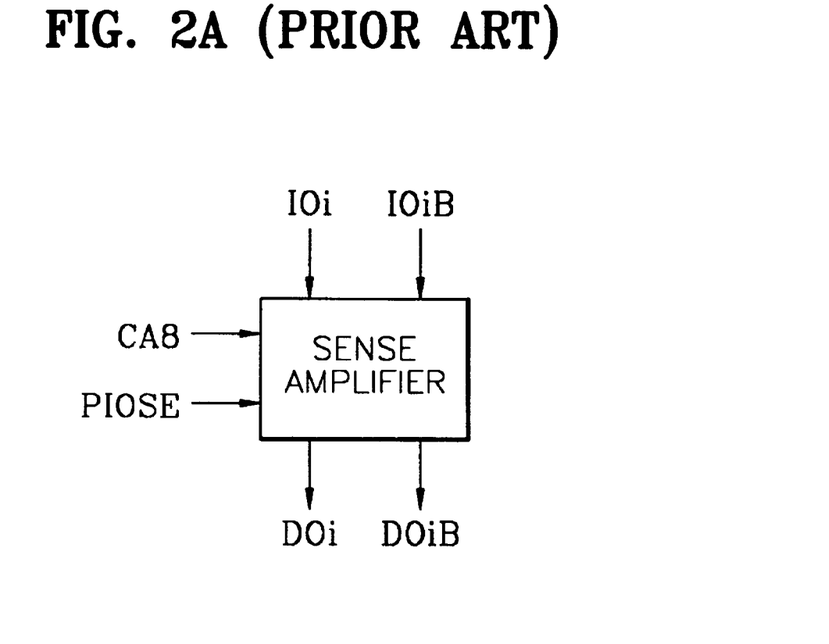
FIGS. 2A and 2B are respectively block diagrams of a sense amplifier and a write driver for the memory device of FIG. 1.
Figure 2B:
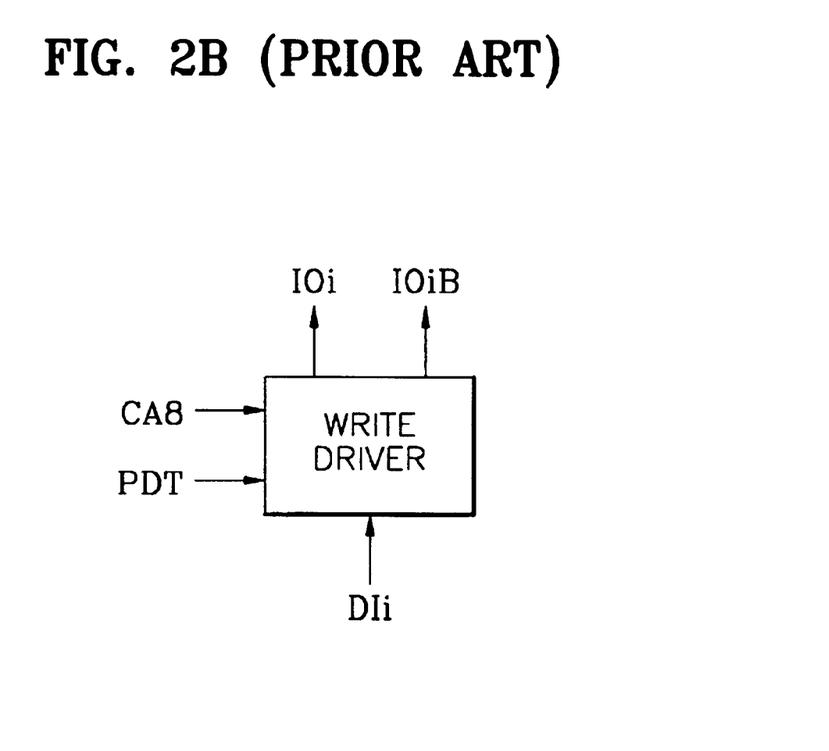

FIGS. 2A and 2B are block diagrams of sense amplifiers S10 to S13 and S16 to S19 and write drivers W10 to W13 and W16 to W19 of FIG. 1. In FIGS. 2A and 2B, signal POISE is a sense amplifier enable signal, IOi and IOiB are an input/output line and a complementary input/output line, DOi and DOiB are a data output line and a complementary data output line, signal PDT is a write driver enable signal, and line DIi is a data input line.

Figure 3A:
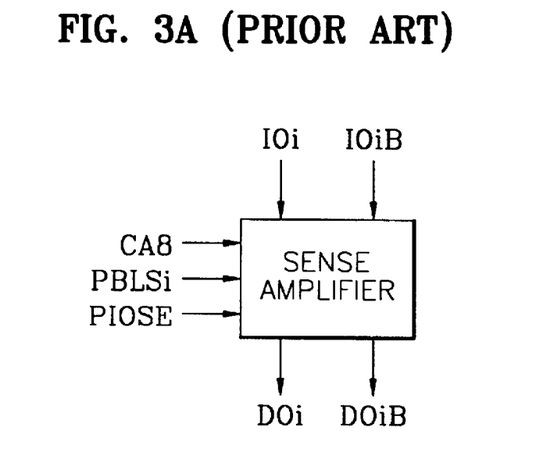
FIGS. 3A and 3B are respectively block diagrams of a sense amplifier and a write driver which are at edges of a sense amplifying and write driving block in the memory device of FIG. 1.
Figure 3B:
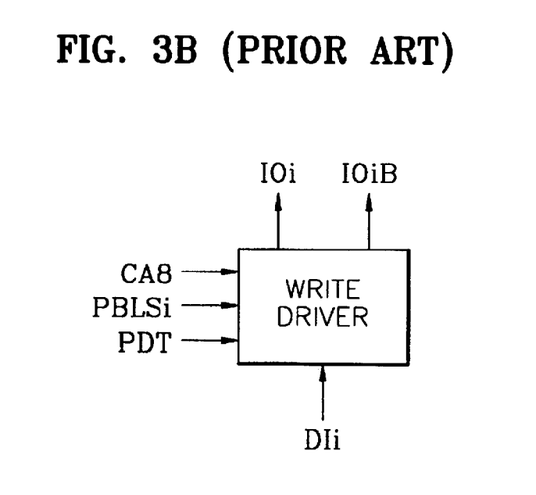

FIGS. 3A and 3B are respectively block diagrams of a sense amplifier and a write driver unit such as sense amplifiers S14 and S15 and write drivers W14 and W15, which are at the edges of sense amplifying and write driving block 103. In FIGS. 3A and 3B, signal PBLSi is a block select signal, and signals POISE, CA8 and PDT, and lines IOi, IOiB, DOi, DOiB and DIi are described above.

Figure 4:
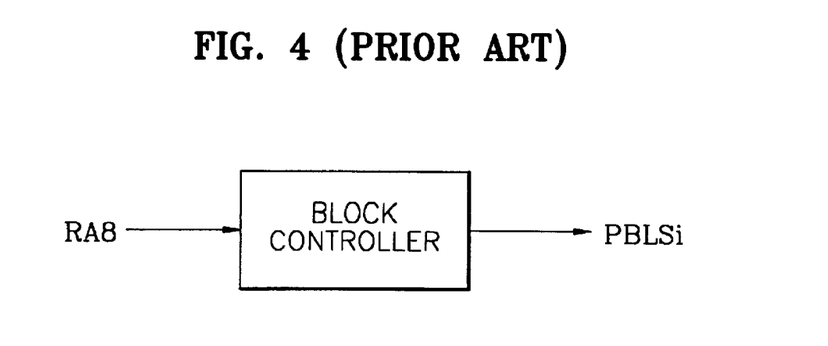
FIG. 4 is a block diagram of a block controller for generating a block select signal.

FIG. 4 is a block diagram of a block controller which generates block select signal PBLSi from row address bit RA8.

As described above, in the conventional semiconductor memory device, the number of pages and the page length are fixed. Thus, the conventional semiconductor memory device cannot adjust the number or length of pages for a memory access operation.

SUMMARY OF THE INVENTION

In accordance with an embodiment of the present invention, a paged memory device includes a page control circuit for generating a control signal that varies the number and length of pages in response to a page control signal. The control signal controls a sense amplifying and write driving circuit for multiple memory cell array blocks. The page control circuit controls a row address and a column address to generate the control signal, that is, varies the number and the length of pages. In response to the control signal, the sense amplifying and write driving circuit senses, amplifies, and outputs data from a memory cell array block selected from among the memory cell array blocks, and writes data into a memory cell array block selected from among the memory cell array blocks.

Preferably, the page control circuit may include an address buffer, a block controller and a control signal generator. The address buffer buffers the most significant bit (MSB) of the row address and outputs the buffered result, or ignores the MSB of the row address depending on the page control signal. The block controller generates a block select signal in response to the MSB and the next most significant bit of the row address, and the page control signal controls whether the control signal generator selects the MSB of the column address and or the block select signal as the control signal.

BRIEF DESCRIPTION OF THE DRAWINGS

The features and advantages of the present invention will become more apparent by describing in detail embodiments thereof with reference to the attached drawings in which.

Use of same reference symbols in different figures indicates similar or identical items.

DESCRIPTION OF THE PREFERRED EMBODIMENTS

Figure 5:
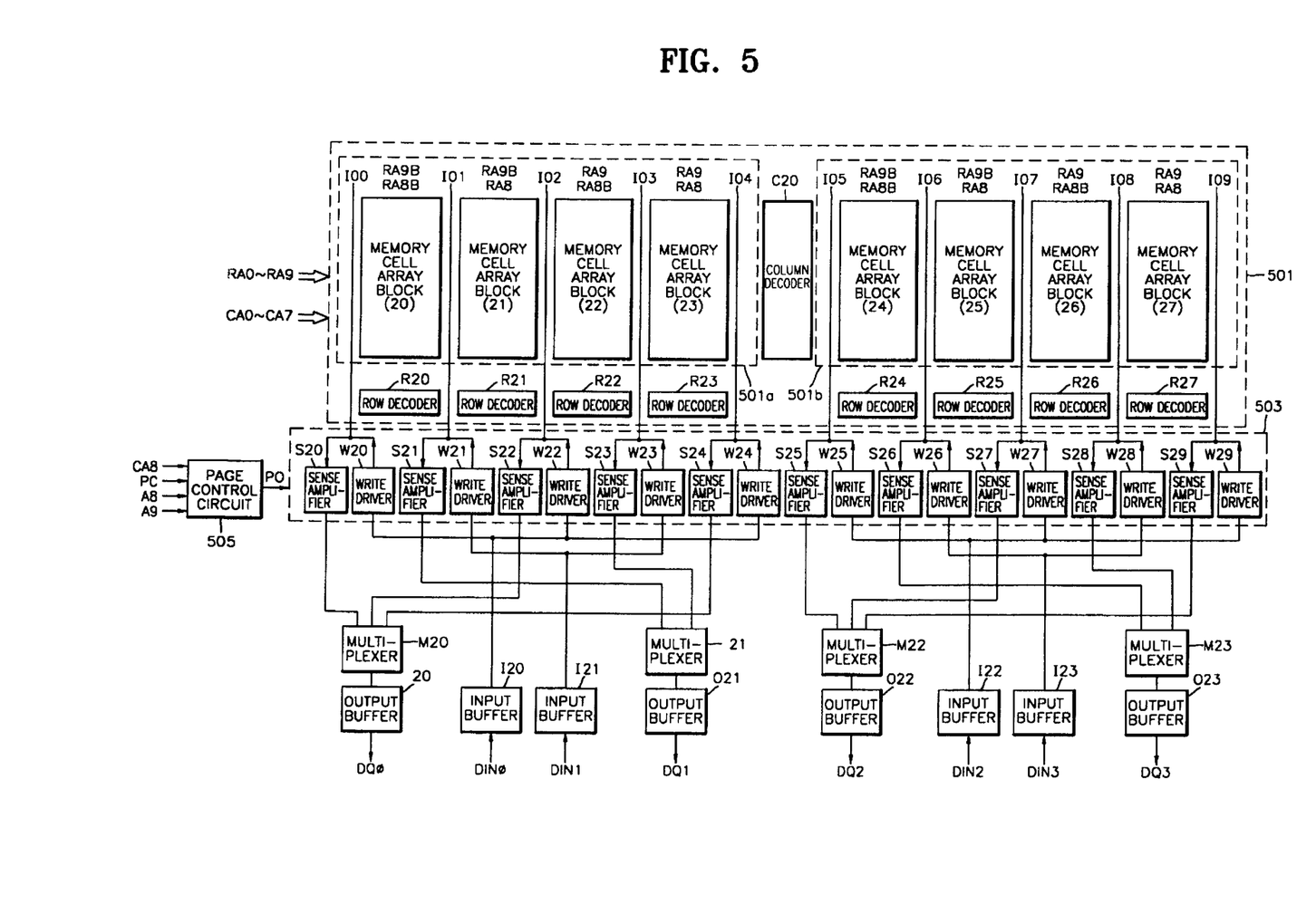
FIG. 5 is a block diagram of a semiconductor memory device according to an embodiment of the present invention.

FIG. 5 shows a semiconductor memory device 500 according to an embodiment of the present invention. Device 500 includes a memory block 501, a sense amplifying and write driving circuit 503, a page control circuit 505, four input buffers I20 to I23, four output multiplexers M20 to M23, four output buffers O20 to O23, four data outputs DO0 to DO3, and four data inputs DIN0 to DIN3. For illustrative purposes, the description is directed to an embodiment of the invention where semiconductor device 500 is a 1 Megabit (Mb) DRAM, which uses up to 10 row address bits RA0 to RA9 and up to 9 column address bits CA0 to CA8. In one page mode, bit RA9 is for adjusting the length and number of pages, not for addressing.

Memory block 501 includes eight memory cell array blocks 20 to 27, ten input/output lines IO0 to IO9, eight local row decoders R20 to R27, and a shared column decoder C20. Bits RA0 to RA9 of the row address and bits CA0 to CA8 of the column address determine length and number of pages being accessed (i.e., read or written).

Memory block 501 includes two segments 501a and 501b. Segment 501a includes four memory cell array blocks 20 to 23. Local input/output lines IO0 to IO4 extend in the direction of columns of memory cell array blocks 20 to 23, and each of memory cell array blocks 20, 21, 22, or 23 is between a corresponding pair of local input/output lines (IO0,IO1); (IO1,IO2); (IO2,IO3); or (IO3,IO4). A multiplexer M20 operably connects sense amplifiers S20, S22, and S23 for local input/output lines IO0, IO2, and IO4 to data output DQ0, and a multiplexer M21 operably connects sense amplifiers S21 and S23 for local input/output lines IO1 and IO3 to data output DQ1.

Segment 501b includes four memory cell array blocks 24 to 27. Local input/output lines IO5 to IO9 extend in the direction of columns of memory cell array blocks 24 to 27, and each of memory cell array blocks 24, 25, 26, or 27 is between a corresponding pair of local input/output lines IO5 and IO6, IO6 and IO7, IO7 and IO8, or IO8 and IO9. A multiplexer M22 operably connects sense amplifiers S25, S27, and S29 for local input/output lines IO5,IO7, and IO9 to data output DQ2, and a multiplexer M23 operably connects sense amplifiers S26 and S28 for local input/output lines IO6 and IO8 to data output DQ3.

Selection of a memory cell array block among memory cell array blocks 20 to 27 depends on two most significant bits (MSBs) RA8 and RA9 of the row address. Setting both bits RA8 and RA9 low so that both inverted bits RA8B and RA9B are high selects memory cell array blocks 20 and 24. Setting bit RA9 low and RA8 high selects memory cell array blocks 21 and 25. Setting bit RA9 high and RA8 low selects memory cell array blocks 22 and 26. Setting both bits RA8 and RA9 high selects memory cell array blocks 23 and 27. In the above cases, the first eight bits RA0 to RA7 of the row address select wordlines (not shown) of each of memory cell array blocks 20 to 27.

In accordance with an aspect of the invention, bit RA9B is not restricted to being the complement of bit RA9. Page control circuit 505 makes bits RA9 and RA9B the same or different to select a paging mode for memory device 500. When bits RA9 and RA9B are the same, either both high or both low, RA8 selects which of memory cell array blocks are available for access. If bit RA8 is low, memory cell array blocks 20, 22, 24 and 26 are selected, and if RA8 is high, memory cell array blocks 21, 23, 25 and 27 are selected. In these cases, the first eight bits RA0 and RA7 of the row address still select wordlines of each of memory cell array blocks 20 to 27. Column address bit CA8 still selects which of the available memory cell array blocks are actually accessed. The first eight bits CA0 to CA7 of the column address selects column lines (not shown) within each of memory cell array blocks 20 to 27.

Page control circuit 505 controls bit RA9 of the row address in response to a page control signal PC and generates a control signal PO for varying the length and number of page. Sense amplifying and write driving circuit 503 includes ten sense amplifiers S20 to S29 and ten write drivers W20 to W29. Sense amplifying and write driving circuit 503 senses, amplifies and outputs data from memory cell array blocks selected from among memory cell array blocks 20 to 27 through input/output lines IO0 to IO9, and writes data input from the outside through data inputs DIi into memory cell array blocks selected from among memory cell array blocks 20 to 27. The two data transfer to or from each of the memory cell array blocks 20 to 27 through two input/output lines. Local input/output lines IO0 to IO9 are arranged so that two input/output lines connect to each of memory cell array blocks 20 to 27. For example, when memory cell array block 22 is selected, data transfer through input/output lines IO2 and IO3.

Figure 6A:
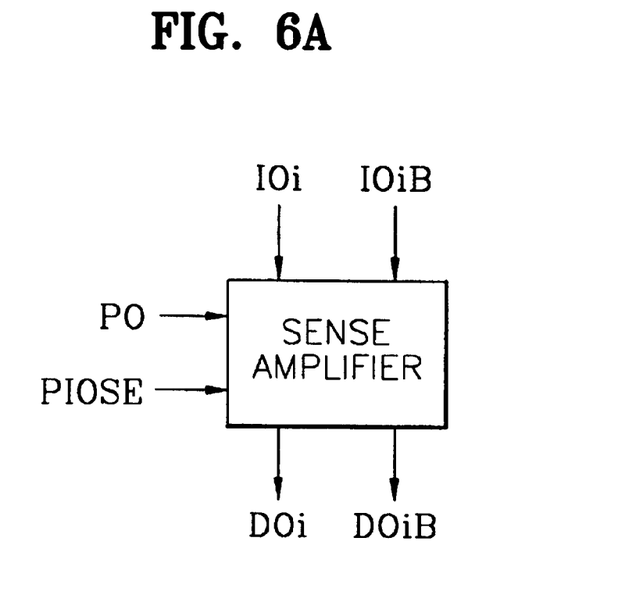
FIGS. 6A and 6B are block diagrams of a sense amplifier and a write driver for the memory device of FIG. 5.
Figure 6B:
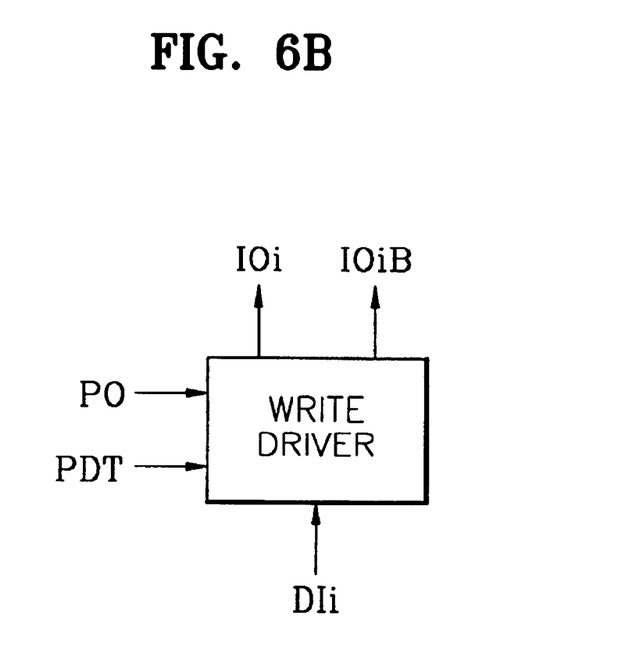

FIGS. 6A and 6B are respectively block diagrams of a sense amplifier and a write driver for device 500 of FIG. 5.

Referring to FIGS. 6A and 6B, in response to a sense amplifier enable signal PIOSE and control signal PO, the sense amplifier senses and amplifies data from a memory cell array block through an input/output line IOi and a complementary input/output line IOiB, and outputs the amplified data to a data output line DOi and a complementary data output line DOiB. The write driver, in response to a write driver enable signal PDT and control signal PO, outputs to input/output line IOi and complementary input/output line IOiB representing data input from the outside through a data input line DIi.

Figure 7:
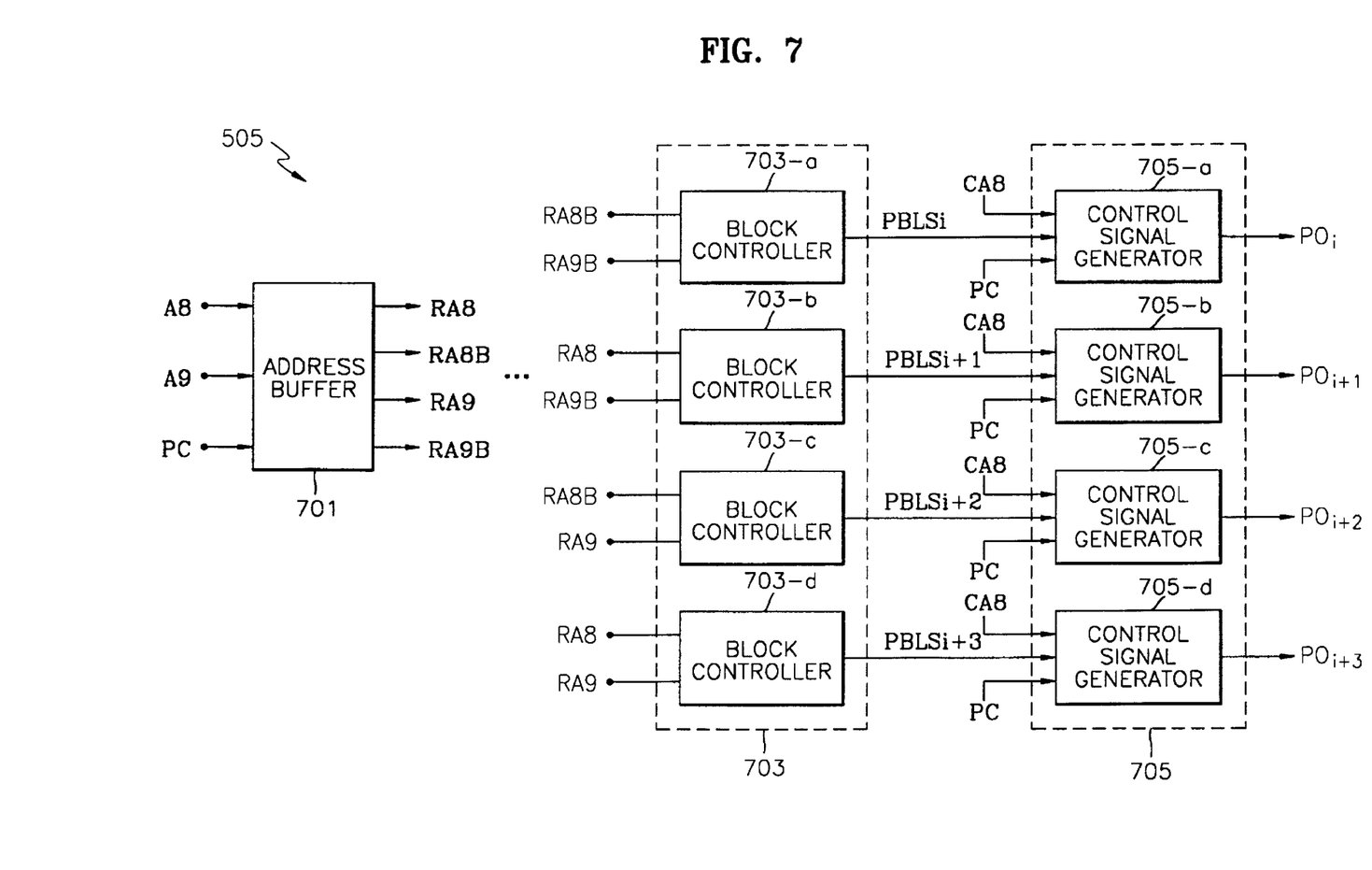
FIG. 7 is a block diagram of a page control circuit for the memory device of FIG. 5.

FIG. 7 is a block diagram of page control circuit 505 of FIG. 5. Page control circuit 505 includes an address buffer 701, a set of block controllers 703 and a set of control signal generators 705. Page control circuit 505 receives page control signal PC, which selects a page mode, and address signals A9 and A8. In a first paging mode, bits A9 and A8 are the two most significant bits of a 10-bit row address. In a second paging mode, bit A8 is the most significant bit of a 9-bit row address, and bit A9 has a "don't care" value.

Address buffer 701 generates a block address signal including bits RA8, RA8B, RA9, and RA9B from the two most significant address bits A8 and A9 and page control signal PC. Address A8 is buffered to row address bit RA8 regardless of the value of page control signal PC. Thus, if bit A8 is high, bits RA8 and RA8B are respectively high and low, and if bit A8 is low, bits RA8 and RA8B are respectively low and high. When page control signal PC is high to indicated the first paging mode, address buffer 701 buffers MSB A9 of the 10-bit row address and generates bits RA9 which is the same as bit A9. Bit RA9B is the complement of bit RA9 in the first paging mode. When page control signal PC is low to indicate the second paging mode, address buffer 701 makes both the RA9 and RA9B high, so that RA9 and RA9B are ignored when selecting memory cell array blocks. Accordingly, bits RA9 and Block controllers 703a to 703d receive block address signals and generate a block select signal PBLSi that corresponds to pair memory cell array blocks i and i+4 for i from 20 to 23. In an exemplary embodiment of the invention, each block controller is an AND gate that receives a combination of bits RA8, RA8B, RA9, and RA9B that correspond to the block select signal and the pair of memory cell array blocks. For example, when signals RA8 and RA9B are asserted, block controller 703b is activated and asserts block select signal PBLS21. When signals RA8, RA9, and RA9B are all asserted, two block controllers 703b and 703d are activated to generate block select signals PBLS21 and PBLS23.

In addition to selecting the available memory cell array blocks, block select signals PBLSi are applied to corresponding control signal generators 705a to 705d. In an exemplary embodiment of the invention, each control signal generators 705a to 705d is a multiplexer having page control signal PC as a select signal. In response to page control signal PC, each of control signal generators selects and outputs either the most significant column address bit CA8 or the corresponding block select signals PBLSi as control signal POi. Specifically, when page control signal PC is low to indicate the second paging mode, each control signal generator 705 outputs the ninth bit CA8 of the column address as control signal PO. When page control signal PC is high to indicate the first paging mode, control signal generators 705a to 705d outputs block select signal PBLSi to PBLSi+3 as control signals POi to POi+3.

When asserted, each control signal POi for i from 20 to 23 enables four sense amplifiers Si, Si+1, Si+5, and Si+6 or four write drivers Wi, Wi+1, Wi+5, and Wi+6 depending on whether an access is a read or write operation. Accordingly, in the first paging mode four sense amplifiers or write drivers are enabled at a time for a 4-bit access.

Hereinafter, a method for varying the number of pages and the page length in the semiconductor memory device according to an embodiment of the present invention is described.

In the second paging mode, page control signal PC is low, and the memory of FIG. 5 receives a 9-bit row address identifying a page and a 9-bit column address identifying a entry within the page. Accordingly, the second paging mode provides $2^9$ pages where each page contains $2^9$ 4-bit data elements. Address buffer 701 makes both bits RA9 and RA9B high, so that bits RA9 and RA9B are ignored. Memory cell array blocks 20, 22, 24 and 26 are available when ninth bit RA8 of a row address is low, and memory cell array blocks 21, 23, 25, and 27 are available when bit RA8 is high. Also, control signal generator 705 outputs ninth bit CA8 of the column address, not PBLSi, in generating control signals PO because page control signal PC is low. Here, when bits CA8 and RA8 are low, memory cell array blocks 20 and 24 are selected for access. When bit CA8 is high and bit RA8 is low, memory cell array blocks 22 and 26 are selected, selected for access. 701 makes both bits RA9 and RA9B high, so that bits RA9 and RA9B are ignored. Memory cell array blocks 20, 22, 24 and 26 are available when ninth bit RA8 of a row address is low, and memory cell array blocks 21, 23, 25, and 27 are available when bit RA8 is high. Also, control signal generator 705 outputs ninth bit CA8 of the column address, not PBLSi, in generating control signals PO because page control signal PC is low. Here, when bits CA8 and RA8 are low, memory cell array blocks 20 and 24 are selected for access. When bit CA8 is high and bit RA8 is low, memory cell array blocks 22 and 26 are selected, selected for access.

In other words, when signals PC, RA8, and CA8 are all low, memory cell array blocks 20 and 24 are selected, and sense amplifying and write driving circuit 503 performs a read or write operation on memory cell array blocks 20 and 24. Subsequently, when only bit CA8 is changed to be high, memory cell array blocks 22 and 26 are selected and subject to the read or write operation.

Similarly, with low PC, high RA8 and low CA8, memory cell array blocks 21 and 25 are selected and subject to the read or write operation. When signal PC is low, bit CA8 is changed to be high, and bit RA8 is high, memory cell array blocks 23 and 27 are selected and subject to the read or write operation.

Accordingly, in the semiconductor memory device according to the embodiment of the present invention, when PC is low, a set including one row line from each four of memory cell array blocks 20, 22, 24, and 26 or 21, 23, 25, and 27 constitutes a page, and the number of pages is equal to twice the number of wordlines tat are selectable by first eight bits RA0 and RA7 of the row address in each of memory cell array blocks 20 to 27, that is, 512. Also, because four rows of memory cells from the array blocks constitute one page and each access accesses two array blocks, the page length is equal the number of column select lines selectable by nine bits CA0 to CA8 of the column address, that is, 512.

On the other hand, when page control signal PC is high, address buffer 701 generates MSB RA9 as the row address, and bit RA9B is the complement of bit RA9. Also, control signal generator 705 considers block select signal PBLSi as control signals POi because page control signal PC is high. Thus, a combination of RA8 and RA9 from which block controller 703 generates block select signal PBLSi selects from among memory cell array blocks 20 to 27. For example, both bits RA8 and RA9 being low selects memory cell array blocks 20 and 24. Bits RA8 and RA9 being high and low respectively selects memory cell array blocks 21 and 25. Bits RA8 and RA9 being low and high respectively selects memory cell array blocks 22 and 26. Both bits RA8 and RA9 being high selects memory cell array blocks 23 and 27.

Accordingly, when page control signal PC is high, regardless of CA8, one of the memory cell array blocks 20 to 23 and one of memory cell array blocks 24 to 27 are selected and subject to a write or read operation by sense amplifying and write driving circuit 503. When page control signal PC is high, a page includes two rows in two memory cell array. The, when signal PC is high, the number of pages is equal to the number of wordlines that are selectable by first ten bits RA0 to RA9 of the row address in each of memory cell array blocks 20 to 27, that is, 1024. The page length is equal to the number of column select lines selectable by the first eight bits CA0 to CA7 or the column address, that is, 256.

As described above, the present invention provides a semiconductor device, in which the number of pages and the page length can be varied by a page control signal. Depending on the page control signal, the number of pages and the page length can be varied; 512 and 512 or 1024 and 256. In practical application, the page control signal can be fixed in packaging the semiconductor devices in a way such as wire bonding option, so that the semiconductor devices can have a set of number of pages and page length can that are available in the semiconductor device. The wire bonding operation decides which bonding pads (or terminal pads) of the device connect to external terminals of the package of the device. Alternatively, in a system, a control circuit can send the page control signal to the semiconductor devices having an adjustable number of pages and an adjustable page length.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A semiconductor device in which a page length and a page depth respectively are $2^{NR}$ and $2^{NC}$ where NR is the number of bits in a row address and NC is the number of bits in a column address, the semiconductor device comprising:
    a plurality of memory cell array blocks; and
    a page control circuit which, depending on a page control signal, controls the number of bits in the row address used and the number of bits in the column address used to generate a control signal which varies the page length and page depth.

2. The semiconductor device of claim 1, wherein the page control circuit comprises:
    an address buffer that generates a block address signal in response to the page control signal;
    a plurality of block controllers that generate a block select signal in response to the block address signal from the address buffer; and
    a plurality of control signal generators that output one of the block select signals and a most significant bit of the column address as the control signal in response to the page control signal.

3. The semiconductor device of claim 1, wherein the page control signal is fixed to the semiconductor device, so that a set of the page length and the page depth are permanently selected from among a plurality of sets of the number of pages and the page depth that are available in the semiconductor device.

4. The semiconductor device of claim 3, wherein the page control signal is fixed by a wire bonding option in packaging the semiconductor device.

5. The semiconductor device of claim 1, wherein the page control signal is applied to the semiconductor device from an external control circuit.

6. The semiconductor device of claim 1, further comprising:
    a plurality of sense amplifiers; and
    a plurality of write drivers; wherein
        the control signal selects the sense amplifiers and the write drivers.

7. The semiconductor device of claim 1, wherein:
    in a first mode, one of the memory cell array blocks is activated by two upper most significant bits of the row address transmitted to the block controller; and
    in a second mode, the most significant bit of the row address is ignored, and two blocks, discriminated by a most significant bit of a column address, are activated.

8. A semiconductor device in which a page length and a page depth respectively are $2^{NR}$ and $2^{NC}$ where NR is the number of bits in a row address and NC is the number of bits in a column address, the semiconductor device comprising:
    a plurality of memory cell array blocks; and
    a page control circuit which, depending on a page control signal, controls the number of bits in the row address used to generate a control signal which varies the page length and page depth.

9. A semiconductor device in which a page length and a page depth respectively are $2^{NR}$ and $2^{NC}$ where NR is the number of bits in a row address and NC is the number of bits in a column address, the semiconductor device comprising:
    a plurality of memory cell array blocks; and
    a page control circuit which, depending on a first control signal, controls the number of bits in the row address and the number of bits in the column address used to generate a second control signal which varies the page length and page depth.

10. A semiconductor device in which a page length and a page depth respectively are $2^{NR}$ and $2^{NC}$ where NR is the number of bits in a row address and NC is the number of bits in a column address, the semiconductor device comprising:
    a plurality of memory cell array blocks; and
    a page control circuit which, depending on a first control signal, determines whether a bit in the column address will be used to generate a second control signal which varies the page length and page depth.

* * * * *

UNITED STATES PATENT AND TRADEMARK OFFICE
CERTIFICATE OF CORRECTION

PATENT NO. : 6,694,422 B2
DATED : February 17, 2004
INVENTOR(S) : Natarajan Ramanan It is certified that error appears in the above-identified patent and that said Letters Patent is hereby corrected as shown below:

Column 3,
Line 45, after "stations" delete "$S_i$ and $S_{i+}$," and insert -- $S_i$ and $S_{i+1}$ --.

Column 4,
Line 63, after "$S_2^-$" insert -- , --
Line 65, after "$S_1^-$" insert -- , --
Line 67, after "$S_3^-$" insert -- , --

Column 5,
Lines 18, 22, 27, 31 and 36, after "$S_4^-$" insert -- , --

Lines 25 and 34, after "$S_3^-$" insert -- , --

Lines 29, after "$S_1^-$" insert -- , --

Line 37, delete "$C_{19,4} : \{S_4^+, S_2$ follows." and insert:

-- $C_{19,4} : \{S_4^+, S_2^-, S_4^-, S_1^-, S_3^-, S_4^+\}$   $C_{20,4} : \{S_4^+, S_4^-, S_2^-, S_1^-, S_3^-, S_4^+\}$
$C_{21,4} : \{S_4^+, S_3^-, S_2^-, S_1^-, S_4^-, S_4^+\}$   $C_{22,4} : \{S_4^+, S_3^-, S_2^-, S_4^-, S_1^-, S_4^+\}$
$C_{23,4} : \{S_4^+, S_3^-, S_4^-, S_2^-, S_1^-, S_4^+\}$   $C_{24,4} : \{S_4^+, S_4^-, S_3^-, S_2^-, S_1^-, S_4^+\}$

In a cyclic schedule, for a given cycle the cycle time can be derived as follows: --

Column 6,
Line 10, after "$1_1^-$" delete "$r_{1,2}$ }" and insert -- $t_{1,2}$ } --

Column 8,
Line 33, after "optimization" delete "paramters" and insert -- parameters --

Column 10,
Line 36, after "Let" delete "$S_{ij1}$" and insert -- $S_{iji}$ --
Line 37, after "the" delete "$j_2^{th}$" and insert -- $j_i^{th}$ --

Line 38, delete "$v_2$" and insert -- $v_i$ --

Column 11,
Line 18, delete "$C_{10,4}^4$" and insert -- $C_{10,4}^5$ --

Line 33, after "$S_1^-$" insert -- , $S_3^+$ --

Line 48, after "from $S_{1,1}$" insert -- , --

UNITED STATES PATENT AND TRADEMARK OFFICE
CERTIFICATE OF CORRECTION

PATENT NO. : 6,694,422 B2
DATED : February 17, 2004
INVENTOR(S) : Natarajan Ramanan It is certified that error appears in the above-identified patent and that said Letters Patent is hereby corrected as shown below:

Column 12,
Line 64, after "and" delete "$S_{2+1}$" and insert -- $S_{i+1}$ --

Column 13,
Line 2, after "(also $S_{i+1}$ and" delete "$S_2$" and insert -- $S_i$ --
Lines 14 and 19, after "$S_1^-$, $S_2^-$" delete ","

Line 14, after "$S_1^-$, $S_4^-$" delete ","
Line 16, after "$S_4^-$, $S_1^-$" delete ","

Line 16, after "$S_2^-$, $S_4^-$" delete ","

Line 19, after " "$S_2^-$, $S_1^-$" " delete ","

Line 40, after "addition," delete "$Y_i$, $i$ +1" and insert -- $Y_i, i$ +1 --
Line 54, after "$S_3$ :" delete "$(t_{2,3})$" and insert -- $(t_{2,3})$ --

Signed and Sealed this

Ninth Day of November, 2004

JON W. DUDAS
*Director of the United States Patent and Trademark Office*

UNITED STATES PATENT AND TRADEMARK OFFICE
CERTIFICATE OF CORRECTION

PATENT NO.     : 6,694,422 B1
DATED          : February 17, 2004
INVENTOR(S)    : Gyu-hong Kim It is certified that error appears in the above-identified patent and that said Letters Patent is hereby corrected as shown below:

This certificate supersedes Certificate of Correction issued November 9, 2004, the number was erroneously mentioned and should be vacated since no Certificate of Correction was granted.

Signed and Sealed this

Twenty-eighth Day of June, 2005

JON W. DUDAS
*Director of the United States Patent and Trademark Office*